US008891322B2

(12) United States Patent
Pyeon

(10) Patent No.: US 8,891,322 B2
(45) Date of Patent: Nov. 18, 2014

(54) MEMORY SYSTEM WITH A LAYER COMPRISING A DEDICATED REDUNDANCY AREA

(71) Applicant: Hong Beom Pyeon, Kanata (CA)

(72) Inventor: Hong Beom Pyeon, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 99 days.

(21) Appl. No.: 13/621,486

(22) Filed: Sep. 17, 2012

(65) Prior Publication Data

US 2013/0070547 A1    Mar. 21, 2013

Related U.S. Application Data

(60) Provisional application No. 61/535,522, filed on Sep. 16, 2011.

(51) Int. Cl.
*G11C 29/00* (2006.01)
*G11C 29/44* (2006.01)
*G11C 29/12* (2006.01)

(52) U.S. Cl.
CPC ...... *G11C 29/785* (2013.01); *G11C 2029/1206* (2013.01); *G11C 29/44* (2013.01); *G11C 2029/4402* (2013.01)
USPC ........ 365/200; 365/201; 365/225.7; 365/174; 365/180

(58) Field of Classification Search
CPC ...................... G11C 29/785; G11C 2029/4402; G11C 29/4401; G11C 29/027; G11C 29/24
USPC ....................... 365/200, 201, 225.7, 174, 180
See application file for complete search history.

(56) References Cited

U.S. PATENT DOCUMENTS

| | | | |
|---|---|---|---|
| 6,418,068 B1 | 7/2002 | Raynham | |
| 6,650,577 B2 | 11/2003 | Hartmann | |
| 7,218,559 B2 | 5/2007 | Satoh | |
| 7,402,897 B2 | 7/2008 | Leedy | |
| 7,779,311 B2 | 8/2010 | Ong | |
| 7,796,446 B2 | 9/2010 | Ruckerbauer et al. | |
| 7,872,936 B2 | 1/2011 | Blankenship | |
| 7,936,622 B2 | 5/2011 | Li et al. | |
| 2001/0000992 A1 | 5/2001 | Carson et al. | |
| 2002/0009003 A1 | 1/2002 | Hartmann | |
| 2008/0198646 A1 | 8/2008 | Park et al. | |

(Continued)

OTHER PUBLICATIONS

Kang, Uksong, "8 Gb 3-D DDR3 DRAM Using Through-Silicon-Via Technology", IEEE Journal of Solid-State Circuits, vol. 45, No. 1, pp. 111-119, , Jan. 2010.

*Primary Examiner* — Thong Q Le
(74) *Attorney, Agent, or Firm* — Dennis R. Haszko

(57) ABSTRACT

Systems and methods are disclosed that may include a first layer comprising a first redundant memory element, an input/output interface, a first layer fuse box, and a fuse blowing control. These systems and methods also may include a second layer coupled to the first layer through a first connection comprising a second layer memory element and a second layer fuse box coupled to the first redundant memory element. In addition, these systems and methods may further include a redundancy register coupled to the first layer, wherein upon the failure of part of the second layer memory element, the redundancy register provides information to the fuse blowing control that allocates part of the first redundant memory element to provide redundancy for the failed part of the second layer memory element by blowing elements in the first layer fuse box and the second layer fuse box.

16 Claims, 13 Drawing Sheets

(56) References Cited

U.S. PATENT DOCUMENTS

| | | |
|---|---|---|
| 2009/0213634 A1 | 8/2009 | Shibata |
| 2010/0070696 A1 | 3/2010 | Blankenship |
| 2010/0121994 A1 | 5/2010 | Kim et al. |
| 2010/0140686 A1* | 6/2010 | Arizono ........................ 257/324 |
| 2011/0298011 A1* | 12/2011 | Lee et al. ...................... 257/204 |

* cited by examiner

FIGURE 1 – MASTER LAYER

FIGURE 2 – SLAVE LAYER

MEMORY SYSTEM WITH A LAYER COMPRISING A DEDICATED REDUNDANCY AREA

CROSS-REFERENCE TO RELATED APPLICATION AND CLAIM OF PRIORITY

The present application claims priority to U.S. Provisional Patent Application No. 61/535,522.

TECHNICAL FIELD OF THE INVENTION

The present invention generally relates to electronic memory, and more specifically to the arrangement of redundant elements within groups of semiconductor elements.

BACKGROUND OF THE INVENTION

High density memory devices may suffer from many memory faults due to the increasingly small cell pitch of modern process technology. Discarding high density memory devices that have these faults is unacceptable in terms of manufacturing yield. Solutions to these small and repairable numbers of memory faults have historically required large areas of each high density memory device chip memory array to be pre-allocated to provide redundancy for the memory faults. This approach is costly both in terms of space lost in memory arrays and density when encountering a memory fault.

Systems and methods are needed that can provide redundancy for faults within high density memory devices, while minimizing space required for redundancy and allowing effective control of redundancy assignment.

SUMMARY

In one embodiment of the disclosure, systems and methods are disclosed that may include a first layer comprising a first redundant memory element, an input/output interface, a first layer fuse box, and a fuse blowing control. These systems and methods may also include a second layer coupled to the first layer through a first connection comprising a second layer memory element and a second layer fuse box coupled to the first redundant memory element. In an additional embodiment, these systems and methods may include a redundancy register coupled to the first layer, wherein upon the failure of part of the second layer memory element, the redundancy register provides information to the fuse blowing control that allocates part of the first redundant memory element to provide redundancy for the failed part of the second layer memory element by blowing elements in the first layer fuse box and the second layer fuse box.

In another embodiment, a method is disclosed that includes verifying a plurality of memory cells located across at least three layers of semiconductor material comprising memory cells, determining the location of faults within the at least three layers of semiconductor material comprising memory cells, and assigning a type to each of the faults within the at least three layers of semiconductor material comprising memory cells. This method may also include determining if the chip is repairable based upon the location and type of faults, by repairing the faults of the at least three layers using the redundancy provided in the master layer, and storing repair information on each one of the layers.

BRIEF DESCRIPTION OF THE DRAWINGS

Embodiments according to the present invention will now be described with reference to the Figures, in which like reference numerals denote like elements.

DETAILED DESCRIPTION OF THE INVENTION

Figure 1:
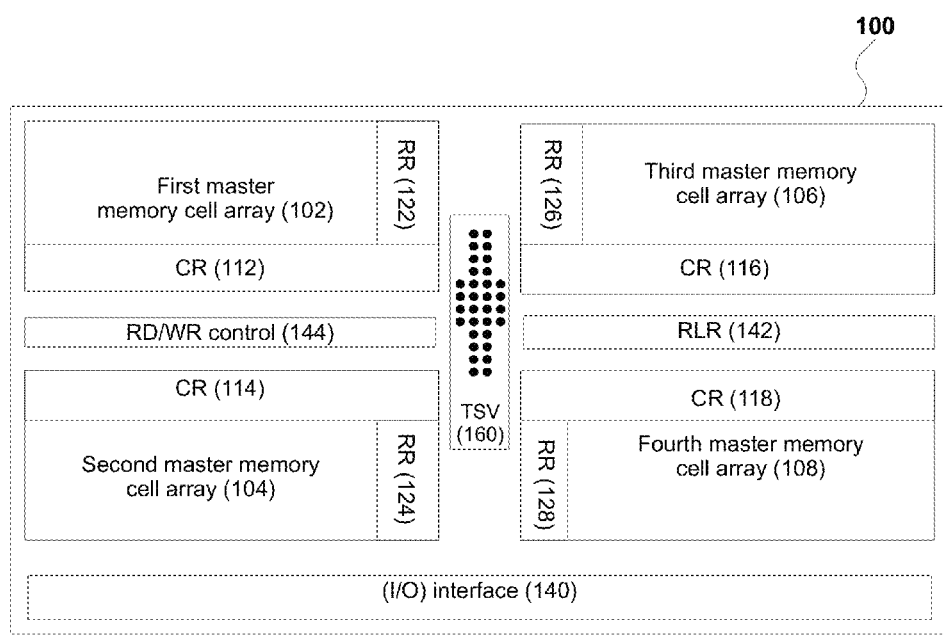
FIG. 1 is a block diagram of a master layer according to one embodiment of the present disclosure.

Definitions for certain words and phrases are provided throughout this patent document. Those of ordinary skill in the art should understand that in many, if not most instances, such definitions apply to prior as well as future uses of such defined words and phrases.

While this detailed description has set forth some embodiments of the present invention, the appended claims are sufficiently supported to cover and will cover other embodiments of the present invention which differ from the described embodiments according to various modifications and improvements.

In dynamic random-access memory (DRAM), memory cells are used to store data through a plurality of data storage elements including capacitors, parasitic body capacitors, and other memory storage approaches. During semiconductor manufacturing, it is possible that a small number of the data storage elements may be defective. In the event of such a failure, the semiconductor device can compensate through the use of redundancy, where alternative storage elements are used to replace those that have failed. This redundancy often takes the form of a column redundancy (CR) or a row redundancy (RR).

Advances in semiconductor manufacturing have given rise to the ability to have multiple layers of semiconductor bonded together. These layers are sometimes referred to as substrates of semiconductor or individual chips. These multiple layers provide mechanisms to increase the capacity of semiconductor chips with a minimal increase in the area of the components. For this purpose, the combination of multiple layers may be referred to herein as a "system" of layers. While aggregating space through a plurality of layers increases available space, problems persist in optimizing the efficiency of the semiconductor layers. For example, in a conventional system, each layer has row redundancy and column redundancy, and the overall available space of the chip is not optimized. Systems and methods that could optimize redundancy onto single or multiple layers of a semiconductor product are needed.

As disclosed herein, in one embodiment all redundant storage elements represented by blocks or cells are allocated into a master layer. Slave layers do not have any redundant blocks or cells. The master layer only needs information related to the defect information of slave layers when a memory device comprising multiple layers is created. In addition, as a result of all redundancy information being stored in a master layer, control logic for redundancy can be placed in the master layer so that the peripheral logic blocks on the slave layers can be reduced in size. Once all defect information from stacked slave chips is gathered into the master chip, relevant fuses into the redundancy logic of the master layer are blown, so that any defective locations of either slave layers or the master layer are accessed from the memory controller, the corresponding redundant cells are accessed at the master layer instead of the defective memory cells. Consolidating the redundancy in the master chip ensures more efficient redundant logic control and faster access time than conventional approaches.

In effect, the present disclosure enables defects on slave chips to be easily fixed with the redundancy of the master chip. Disclosed herein are various designs, systems, apparatuses, and methods to put row and column redundancies into at least one master layer of all attached semiconductor layers by allocating redundancy located on at least one master layer for defect replacement of at least one slave layer. Additionally disclosed herein are various designs, systems, apparatuses, and methods to optimize the manufacture of semiconductor products with multiple layers using information relating to the failure of particular storage elements within a plurality of semiconductor layers. Other innovative designs, systems, apparatuses, and methods relating to semiconductors are disclosed herein, and the listing of one or more advantages should be interpreted as illustrative for the purpose of clarity and not limiting as to the various embodiments disclosed herein.

FIG. 1 illustrates a master layer 100 comprising a first master memory cell array 102, a second master memory cell array 104, a third master memory cell array 106, a fourth master memory cell array 108, a read write control (RD/WR) 144, a redundancy logic and register (RLR) 142, Through Silicon Vias (TSV) 160, and an Input/Output (I/O) Interface 140. Each master memory cell array 102, 104, 106, 108, respectively is coupled to a RR and a CR. The first master memory cell array 102 is coupled to a CR 112 and a RR 122. The second master memory cell array 104 is coupled to a CR 114 and a RR 124. The third master memory cell array 106 is coupled to a CR 116 and a RR 126. The fourth master memory cell array 108 is coupled to a CR 118 and a RR 128. The master layer 100 is configured to communicate with additional layers using the TSVs 160. The size of the CR and RR may be selected based upon the yield demands of the memory product, the type of memory used and process technology node. It is expressly contemplated that, in some alternative embodiments, each defective master memory cell is replaced in the master layer with CR and RR.

The I/O interface 140 is intended to facilitate communication with other devices. The I/O interface 140 may use any of a plurality of standards and may connect using a plurality of different interface schemes, including package balls or pins. In addition, the I/O interface 140 may comprise additional elements such as a buffer or other component to alter or enhance the operation of the master layer 100. The I/O interface 140 may therefore comprise both external connections (interface) and internal components (buffers, communication logic, etc.). It is expressly understood that I/O interface 140 may control the read and write operations of the master layer 100 as well as additional slave layers through the TSV 160.

Redundancy logic and register (RLR) 142 can comprise defect information stored in a redundancy register. This register contains information relating to the row and column addresses of each cell failure of the master layer 100 and any slave layers that the master layer 100 is connected to. Once all defect information from the master layer 100 and any slave layers that are controlled by the master layer 100 are gathered into the master layer 100, relevant fuses in the redundancy logic of the master layer and relevant fuses in the slave layers are blown. When any defect location of either the slave layers or master layer is accessed, its corresponding redundant cells are accessed at the master layer instead of accessing slave layers. This centered redundancy in the master layer promotes more efficient redundant logic control and faster access time than conventional approaches.

RLR 142 is configured to determine whether a system comprising a master layer 100 and at least one slave layer is repairable based upon the total redundant cells and total stacked layers. RLR 142 comprises information related to the number of failures of the master layer 100 and each slave layer controlled by the master layer 100. Once the total failures of a system are determined, a determination of the repairable or non-repairable status may be made as will be described in more detail in FIG. 7.

TSVs 160 are intended to be illustrative of one kind of connection that may be used to provide connectivity to various layers. TSVs are vertical connection elements that can pass substantially, if not completely, through a substrate and are fully contained within the periphery of the stacked substrates. TSVs are distinct from and have largely replaced vertical connection elements running up the outer edges of stacked memory devices. Such external wiring (i.e., wiring disposed on the periphery) was conventionally required to operatively connect the stacked devices. This wiring increases the overall lateral area occupied by the stacked device and typically requires interposing layers between adjacent substrates in the stack. Because TSVs pass vertically upward through a substrate, no additional lateral area is required beyond that defined by the periphery of the largest substrate in the stack. Further, TSVs tend to shorten the overall length of certain critical signal paths through the stack of devices, thereby facilitating faster operating speeds. While TSVs have these advantages, it is expressly understood that other types of connections such as the aforementioned external wiring, could be used in place of TSVs 160. TSVs 160 represent a connection between a master layer and at least one slave layer and should not be interpreted as a limitation as to the intended scope of the present disclosure.

Figure 2:
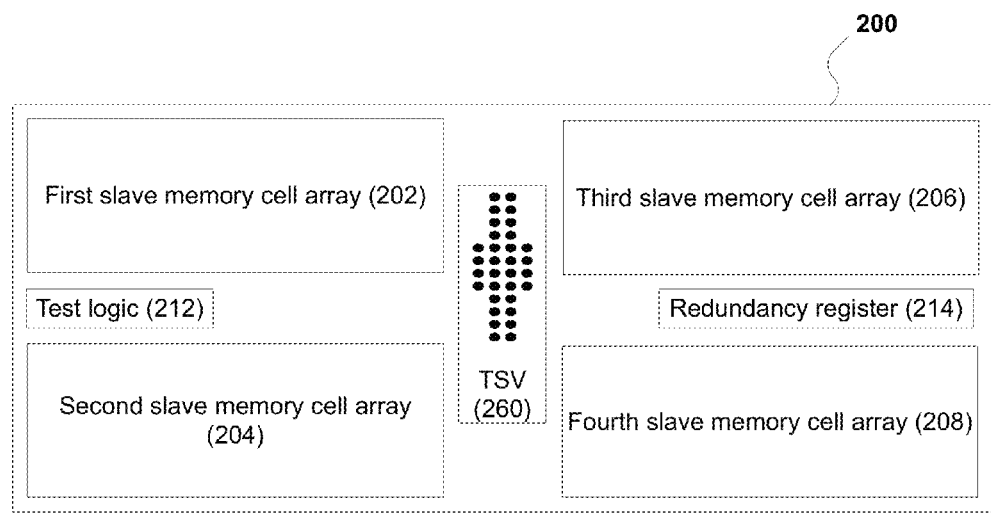
FIG. 2 is a block diagram of a slave layer according to one embodiment of the present disclosure.

FIG. 2 is an example of a slave layer 200. Slave layer 200 comprises a first slave memory cell array 202, a second slave memory cell array 204, a third slave memory cell array 206, and a fourth slave memory cell array 208 and TSVs 260. In some embodiments, slave layer 200 further comprises test logic 212 and a redundancy register 214. In the event of a fault or error in the slave layer 200, redundant memory from the master layer 100 may be used to compensate for the fault or error through the TSV 260. Consequently, no redundancy is shown in FIG. 2, as the redundancy for the slave layer 200 is comprised in the master layer 100. However, it is contemplated that some row and column redundancy may be provided on one, some, or all of the slave layers 200 similarly to the redundancy shown in FIG. 1, and controlled by the master layer 100, in addition to the redundancy provided on the master layer 100. Therefore, the use of row and column redundancies in the master layer 100 should not be considered illustrative and not limiting with respect to additional redundancy on the slave layers 200.

The first slave memory cell array 202, the second slave memory cell array 204, the third slave cell memory array 206, and the fourth slave memory cell array 208 are memory cell arrays substantially similar to those discussed in FIG. 1, except that the memory arrays shown in FIG. 1 further comprise both a RR area and a CR area. As discussed above, these memory cell arrays may be implemented in any way known by one skilled in the art capable of storing information that may be retrieved.

For illustrative purposes, in one embodiment the first master memory cell array 102 provides redundancy for the first slave memory cell array 202. The second master memory cell array 104 provides redundancy for the second slave memory cell array 204. The third master memory cell array 106 provides redundancy for the third slave memory cell array 206. The fourth master memory cell array 108 provides redundancy for the fourth slave memory cell array 208. The relationships described herein are intended for illustrative purposes. A single master memory cell array is shown providing redundancy for a single slave memory cell array on each layer of a system. However, it is expressly understood that in alternative embodiments a single master memory cell array may provide redundancy for a plurality of slave memory cell arrays on a single layer. The description of a single master memory cell being used to provide redundancy for a single slave memory cell on each of a plurality of layers is done for convenience, as it is expressly understood that a single master memory cell may be used to provide redundancy for a plurality of memory cell arrays on a single layer.

The test logic 212 is used to determine the presence of faults within the slave layer 200. It is expressly understood that the functions of the test logic 212 may, in some embodiments, be offloaded to the master layer 100. The presence of the test logic 212 on the slave layer 200 should therefore be understood to be optional.

Redundancy register 214 may be used to store information related to the location of faults within the slave layer 200. It is expressly understood that the redundancy register 214 may be absent in some embodiments, and the data stored by the redundancy register stored in the RLR 142. The presence of the redundancy register 214 therefore is, in some embodiments, optional.

Slave layer 200 is coupled to at least one master layer using the TSVs 260. The TSVs 260 may, as described above, be implemented as an alternative form of connection and the use of the TSV description is for the purpose of clarity and non-limiting.

It is expressly understood that a plurality of the slave layers may be used in the system through the use of an additional address master slave bit (MSB) assigned to each slave layer. The additional address bit is used to identify the location of the fault.

Figure 3:
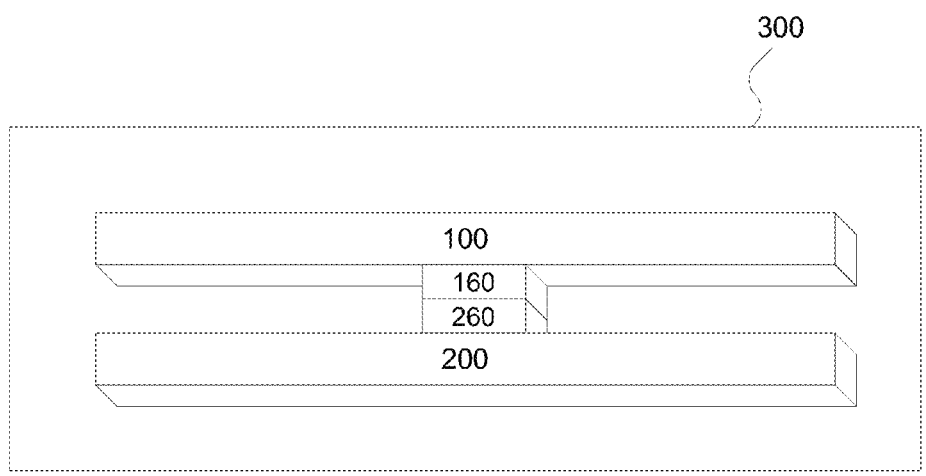
FIG. 3 is a block diagram of the master layer and the slave layer according to one embodiment of the present disclosure.

FIG. 3 is a diagram 300 of the coupling of the master layer 100 to a slave layer 200. In this illustration, the master layer 100 comprises the TSVs 160s that are coupled to the slave layer 200 through the TSVs 260. The connection of the TSVs 160 to the TSVs 260 may, in some embodiments, be a direct electrical connection formed by a physical bond between the TSVs 160 and corresponding ones of the TSVs 260. FIG. 3 should not be interpreted as requiring separate elements or a substantial separation between the master layer 100 and the slave layer 200. FIG. 3 is an example embodiment of one system with both the master layer 100 and the slave layer 200.

Figure 4:
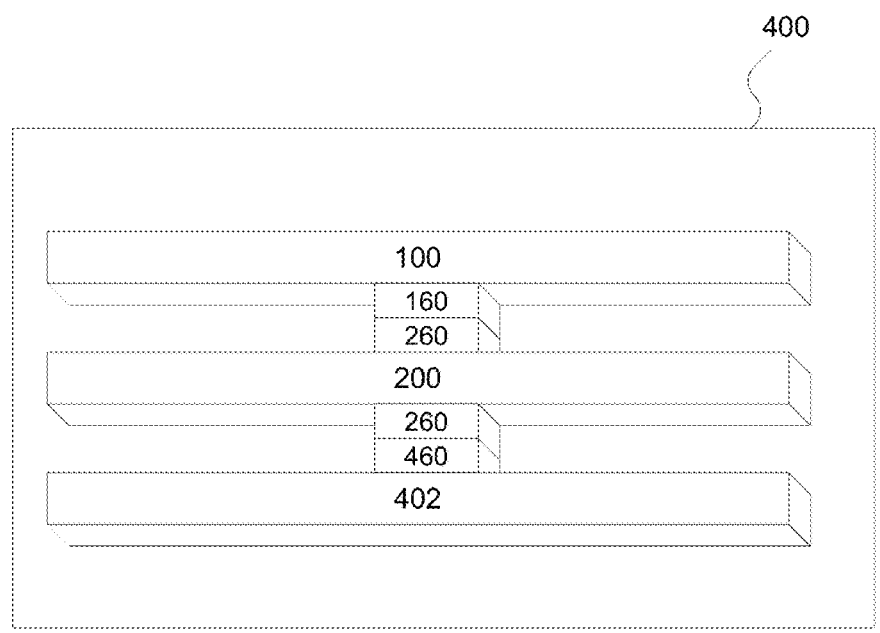
FIG. 4 is a block diagram of the master layer and the slave layer and a third layer according to one embodiment of the present disclosure.

FIG. 4 is a diagram 400 substantially similar to FIG. 3 illustrating the addition of a second slave layer 402 connected to the slave layer 200 through TSVs 460 and the TSVs 260. It is understood that the second slave layer 402 is controlled through the master layer 100 even though the second slave layer is connected to the master layer 100 through the slave layer 200. It is further expressly illustrated that the TSVs 260 of the slave layer 200 may form the connection to more than one layer, as TSVs 260 form connections to both TSVs 160 and TSVs 460. FIG. 4 is an example embodiment of one system with both the master layer 100 and two slave layers. The second slave layer 402 comprises elements substantially similar to those in FIG. 2, including a first, second, third, and fourth slave memory arrays. The first, second, third, and fourth master memory cell arrays of the master layer 100 provide redundancy to the first, second, third, and fourth slave memory cell arrays of the second slave layer 402, respectively.

Figure 5:
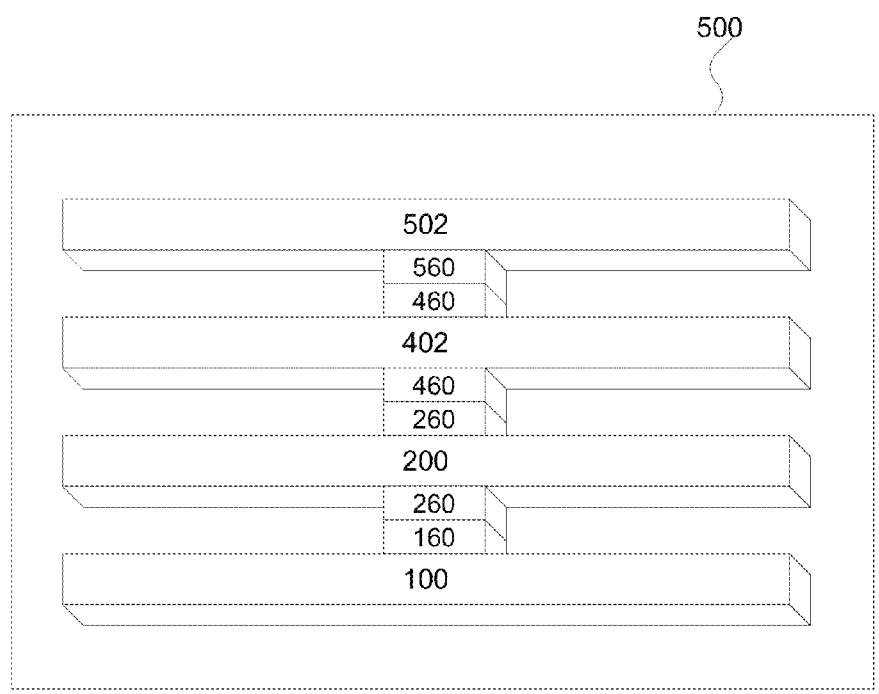
FIG. 5 is a block diagram of the master layer, the slave layer, the third layer, and a fourth layer.

FIG. 5 is a diagram 500 substantially similar to FIG. 4 illustrating the addition of a third slave layer 502 connected to the master layer 100 through TSVs 560, the TSVs 460, the TSVs 260 and the TSVs 160 through the slave layer 200 and the second slave layer 402. FIG. 5 is an example embodiment of one system with the master layer 100 and three slave layers. The third slave layer 502 comprises elements substantially similar to those in FIG. 2, including a first, second, third, and fourth slave memory array. The first, second, third, and fourth master memory cell arrays of the master layer 100 provide redundancy to the first, second, third, and fourth slave memory cell arrays of the first slave layer 200, the second slave layer 402, and the third slave layer 502. It is understood that there may be a connection, such as a ball or pin connection, used to facilitate communication between the master layer 100 and an external device.

Figure 6:
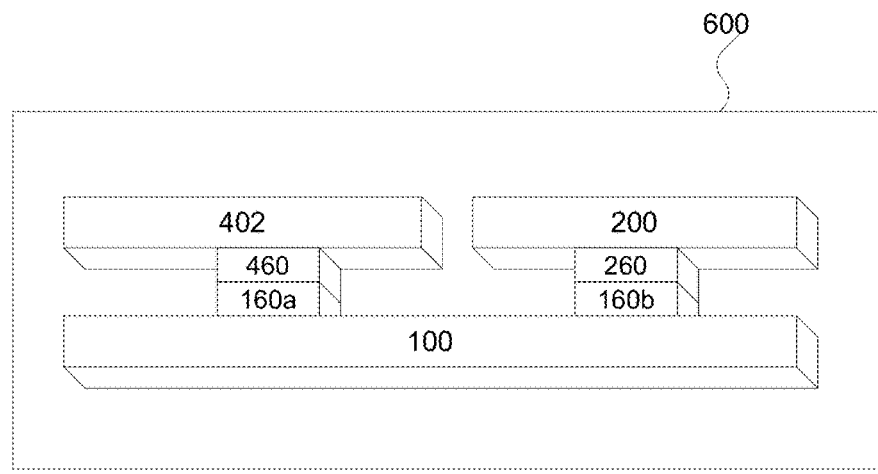
FIG. 6 is another block diagram of the master layer, the slave layer, and the third layer using two separate connections.

The reparability of a system comprising multiple layers is largely dependent upon the type of failures within the system. Failures in the system comprising multiple layers are designated as being row, column, or single type failures. As shown in FIG. 1, there are both CR and RR for each memory cell array. While the delineation between row and column is arbitrary, it is helpful for maintaining the orientation as it relates to different memory cell arrays. A row failure relates to a failure of a group of memory elements along a word line direction or word line relevant defects. A column failure relates to a failure of a group of memory elements along a bit line, as well as bit-line defects and relevant circuit and data lines. A single failure relates to a single random failure of a memory cell element itself. It is expressly understood that particular thresholds may be established for the purpose of efficiency that define when a failure constitutes an entire row or an entire column. For instance, two individual failures may be treated as single random failures if they have neither a row address nor a column address in common, while three may be treated as a row or column failure if they have the same row or column address. In this way, efficient use can be made of available row and column redundancy. The random single bit failures can be replaced with any redundancy (row or column). However, row failures with respect to word line defects or relevant logic failures can only be replaced with row redundancy. Similarly, Column failures can only be fixed with column redundancy. Therefore, detection and gathering of row and column fails should be performed first, and then random failures can be fixed with remaining row or column redundancy. FIG. 6 is an example of a system 600 whereby multiple groups of TSVs are used to connect multiple slaves to the master layer 100. In this example, two separate groups of TSVs (106a, 160b) are used to connect the master to two slaves (200, 402). This is an illustration where multiple slaves are connected to a single master using two separate groups of TSVs. It is expressly understood that in this example, additional support elements may be used on the master layer, e.g., an additional RD/WR control may be used for each additional group of TSVs.

Figure 7:
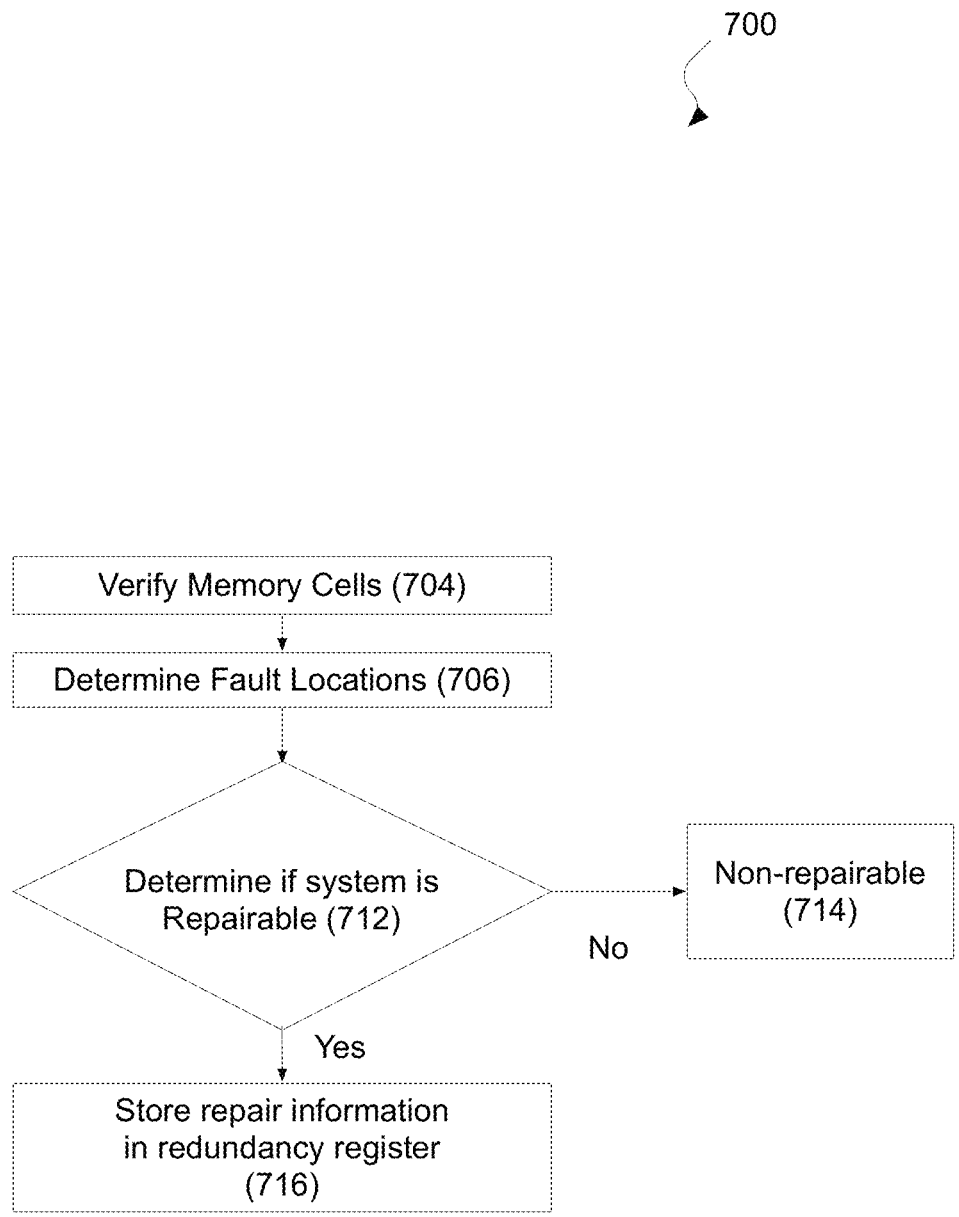
FIG. 7 is a flowchart illustrating a method of determining repairable status of a system according to one embodiment of the present disclosure.

FIG. 7 is a flowchart 700 of one method of determining whether a system comprising multiple layers is repairable. In block 704, the system verifies memory cells. In some embodiments, this verification is performed by testing each memory element to determine that it can read and write, at least one data element. In block 706, the system determines the location of any faults within the layers of the system. The determination in block 706 comprises the collection of all defect locations categorized by being a row, column, or single type failure. In block 712, a determination is made as to whether the chip is repairable. The determination as to whether a system is repairable is based upon the total number of faults, as well as by the number of row and column and random single bit failures within the chip, and can be preformed in many different ways, including those described below.

In a first example, there is an assumption that an electrical link exists between a master and at least one slave memory cell array. In other words, the redundancy CR 112 and RR 122 of the first master memory cell array may be used to repair faults in the first slave memory array of each slave layer. Therefore, the first master memory cell array may compensate for faults in a plurality of different memory cell arrays. Each row and column failure is counted as a single failure.

This relationship for rows for a particular set of memory cell arrays may be shown in the following equation:

$$RF(m)+RF(s)<=RR(m) \quad [\text{Equ. 1}]$$

Where RF(m) is the total number of row faults in the master, RF(s) is the total number of row faults in the slaves in the array, and RR(m) is the number of redundant rows available in the master layer. The relationship for columns may appear as shown in the following equation:

$$CF(m)+CF(s)<=CR(m) \quad [\text{Equ. 2}]$$

Where CR(m) is the total number of column faults in the master, CF(s) is the total number of column faults in the slaves in the array, and CR(m) is the number of redundant columns available in the master layer. The relationship for single random faults may appear as shown in the following equation:

$$(CR(m)+RR(m))-(CF(m)+CF(s)+RF(m)+RF(s)+SF(m)+SF(s))>=0 \quad [\text{Eqn. 3}]$$

Where SF(m) is the total number of single faults in the master and SF(s) is the total number of single faults in the slaves. In this embodiment, in order for a layer to be repairable, all three equations must be satisfied. Upon the determination in block 712 that the system is repairable, the system stores repair information in the RLR 142 in block 716. Upon the determination in block 712 that the system is not repairable, the system stores reports a non-repairable status in block 714.

Figure 8:
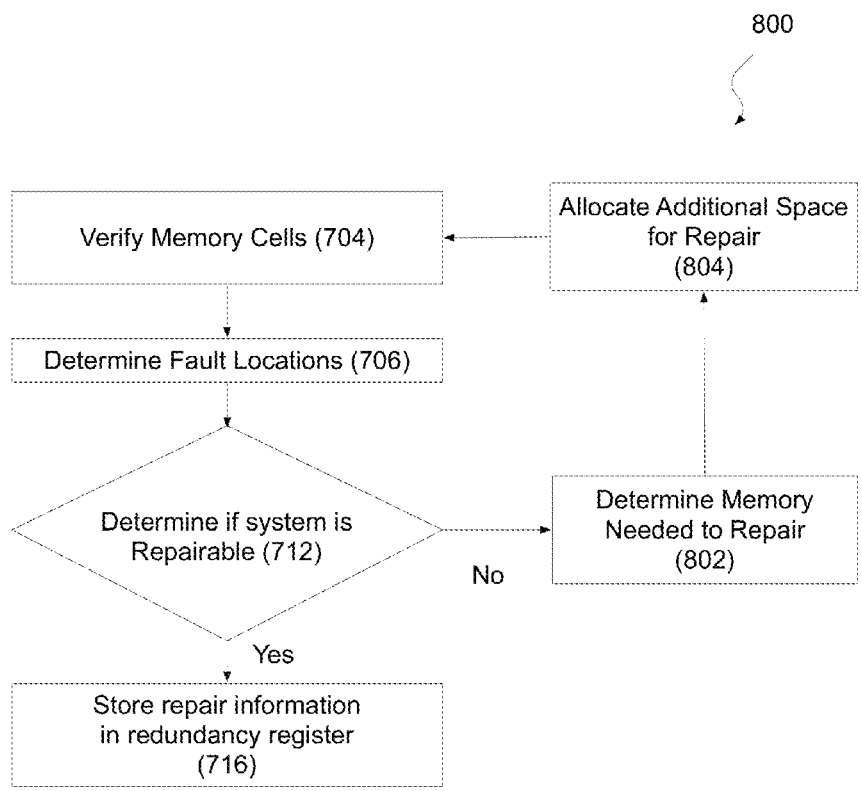
FIG. 8 is a flowchart illustrating a method of reallocating redundancy space according to one embodiment of the present disclosure.

It is expressly understood that during the design phase of the systems disclosed herein, the allocation of RR(m) and CR(m) may be selected based upon requirements of the master and slave layers. FIG. 8 is an example of how this process may be used when determining how to match and optimize layers within a system. FIG. 8 is substantially similar to FIG. 7, with the exception that upon a determination that insufficient space exists for repair in block 802, additional space is allocated for recovery through the selection of a new master layer with a different number of recovery rows and columns as shown in block 804. It is expressly understood that only one master layers should be used for communication to external systems, layers, or chips so as to avoid logic operation contention between two master layers. One of the advantages of the present system is that the determination of the repairable or non-repairable status of each system may be made before making the system, and a determination of the required redundancy of each system may also be made prior to creation of each system, thereby facilitating the selection of an efficient master layer.

Figure 9:
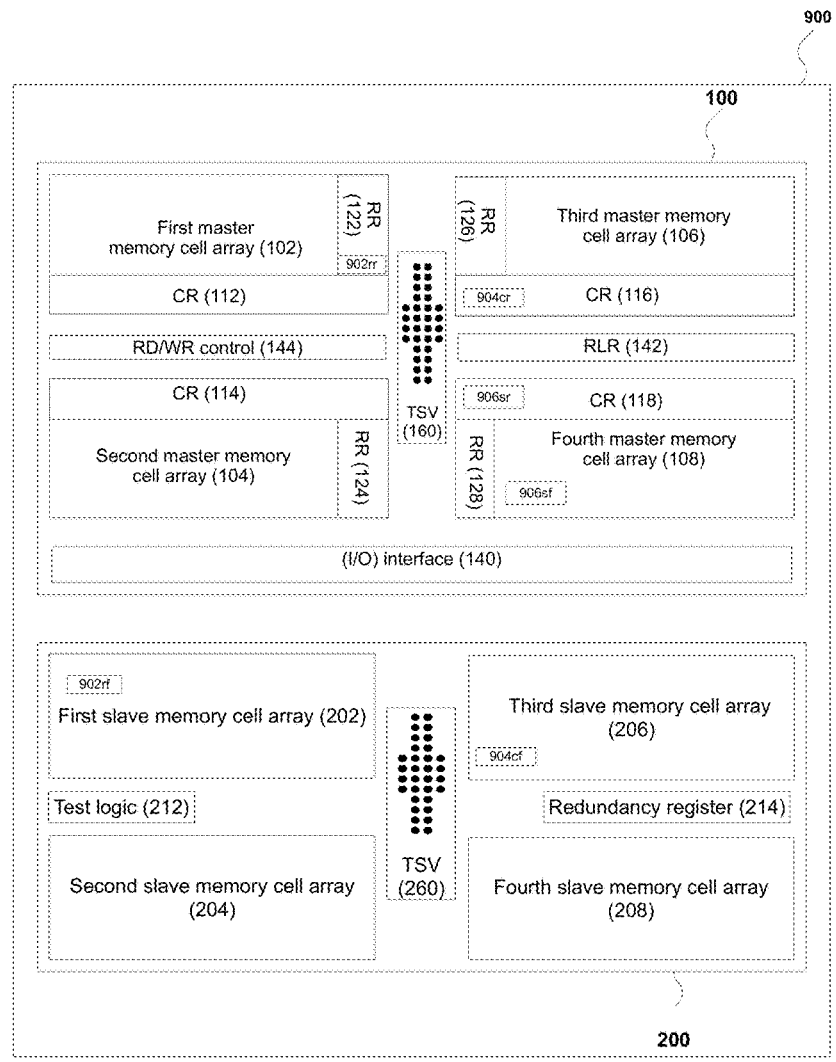
FIG. 9 is a block diagram illustrating the master layer and the slave layer with at least one bad memory block.

FIG. 9 is an example 900 of how recovery rows and columns may be used in a device similar to the embodiment shown in FIGS. 2 and 3. In this embodiment, a row failure (rf) 902rf is shown in the first slave memory array 202, a column failure (cf) 904cf is shown in the third slave memory array, and a single failure (sf) 906sf is shown in the fourth master memory cell array. As previously discussed, the first master memory cell array 102 provides recovery for each of the "first" slave memory cells as well as the first master cell array. Therefore, the recovery for the row failure 902rf is found in RR 122 and illustrated by RR 902rr. The recovery for the column failure 904cf is found in CR 116 and illustrated by CR 904cr. The recovery for the single failure 906sf is found in column recovery 118 and illustrated by single recovery (sr) 906sr.

Figure 10:
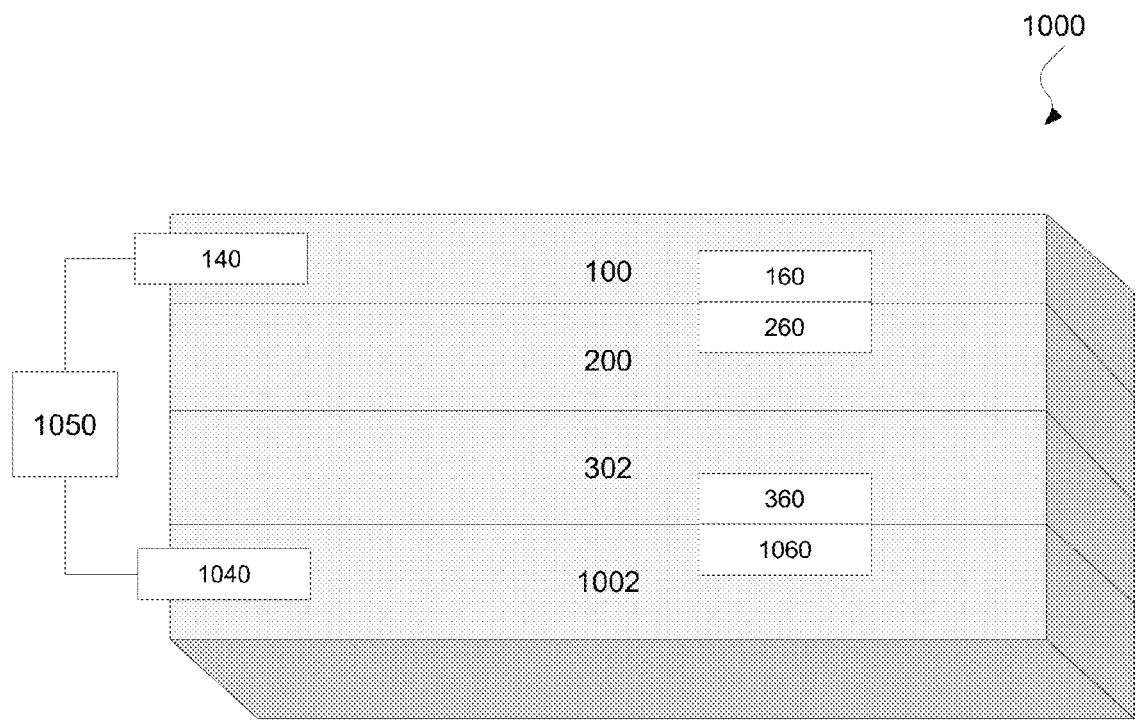
FIG. 10 is a block diagram showing five separate layers where the redundancy is distributed to two master layers.

It is contemplated that a plurality of master layers may be used in a single system 1000. FIG. 10 illustrates a system with the master layer 100 and a second master layer 1002. In this embodiment, the master layer 100 is connected to the slave layer through the TSVs 160 in the master layer and the TSVs 260 in the slave layer. The second master layer 1002 is connected to the second slave layer through the TSVs 360 in the second slave layer 302 and TSVs 1060 in the second master layer 1002. The second master layer 1002 further comprises an I/O interface 1040 substantially similar to the I/O interface 140. In this way, multiple master layers may be used with multiple slave layers in a single system. It is contemplated that an additional component 1050 may be added to bridge the I/O interface 140 and I/O interface 1040 to allow for a single access to system 1000. Alternatively, the component 1050 may be omitted, in which case TSV connections could be formed from only the second master layer 1002 to the package balls for all external control signals, and component 100 could be used as pseudo slave layer. Unconnected external signals of component 100 (additional master layer) could be switched to other TSV-based internal signals which are connected to the package balls through 1002.

Figure 11:
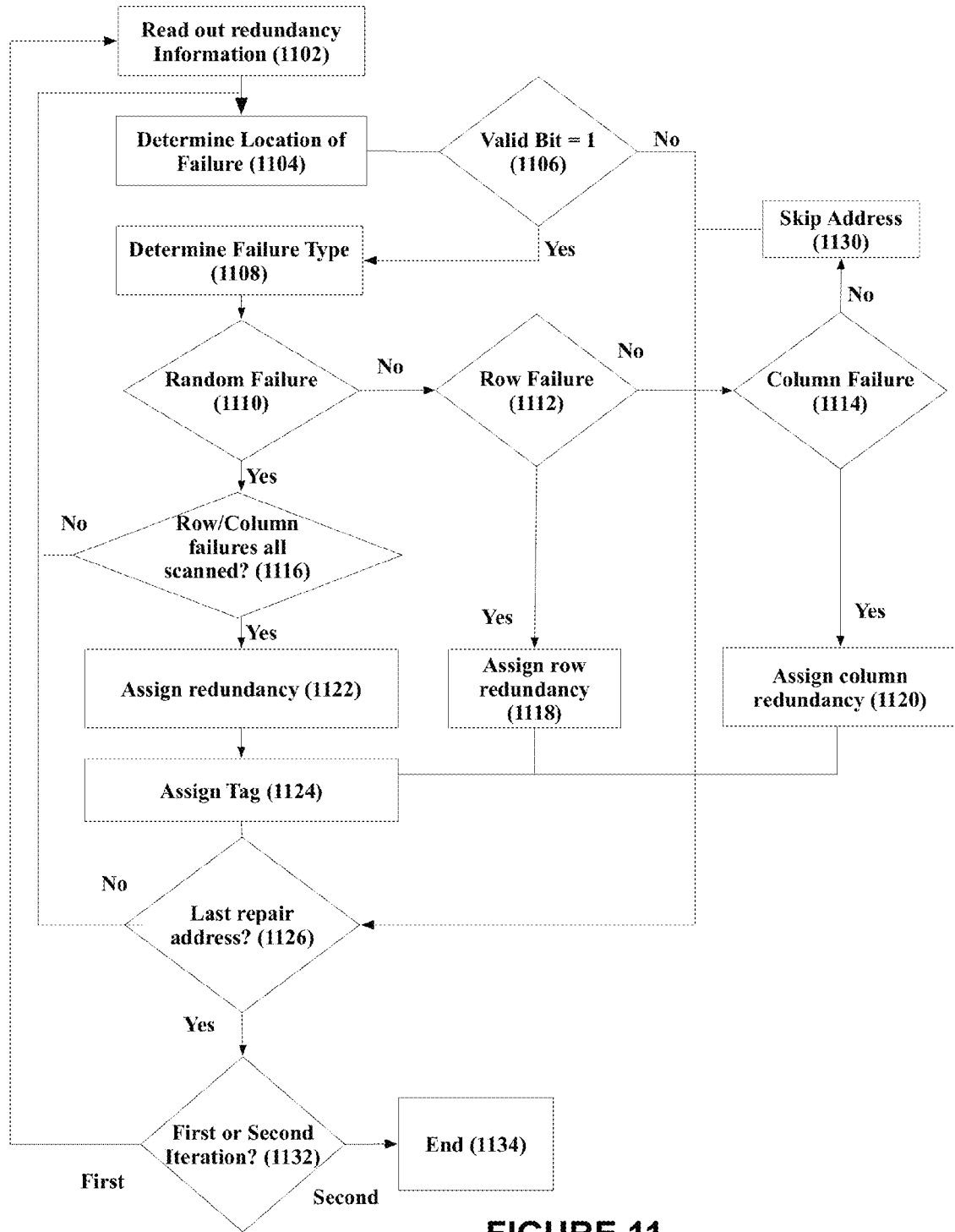
FIG. 11 is a flowchart illustrating a method of reading and assigning bit tags according to one embodiment of the present disclosure.

FIG. 11 is a flowchart showing the redundancy assignment map between master and slave chips. The flowchart illustrated in FIG. 11 is executed two times. In the first iteration, the row and column failures are assigned redundancies. In the second iteration the random failures are assigned redundancies.

In block 1102, the redundancy information is read. This information has four discrete parts, shown in the table below:

TABLE 1

Redundancy Information

| Element Name | Description |
| --- | --- |
| Row | The address of the row relating to the redundancy information. |
| Column | The address of the column relating to the redundancy information. |
| Tag Bits | Two bits of information relating to the status and type of the failure. |
| Valid Bit | One bit of information relating to the redundancy information that relates to a valid failure location ("1") or does not relate to a valid failure location ("0") |

It is expressly understood that the MSB may be appended or prepended to either the row or the column address. In another embodiment, the MSB may be prepended to a record and read prior to the redundancy information being read. So long as there is an MSB that has been conveyed to identify which layer the row and column address of recovery information relates to, the master layer may provide redundancy for the fault.

The tag bits discussed in Table 1 may, in some embodiments, be implemented as shown below in the table below:

TABLE 2

Tag Bits

| Tag Bits | Description |
| --- | --- |
| 00 | Single random failure. |
| 01 | Row failure. |
| 10 | Column failure. |
| 11 | Redundancy previously assigned. |

In block 1104, the location of the failure is determined using the column and row information read in block 1102, and the method proceeds to block 1106. In block 1106, the valid bit is read from the redundancy information. If the valid bit read in block 1106 is '0' then there is a determination of whether the current address is the last repair address in block 1126.

If the valid bit read in block 1106 is '1' then there is a determination as to the failure type in block 1108. The failure type is determined using the tag bits as shown in Table 2. In block 1110 the tag bits are compared to '00' to determine if there is a random failure. If the tag bits equal '00' the method proceeds to block 1116 where there is a determination if all rows and columns have been scanned. If all rows and columns have been scanned, there is an assignment of redundancy in block 1122 and then the tag is changed to '11' in block 1124. If all rows and columns have not been scanned, there is a return to the determination of the location of the next failure in block 1104.

Upon the determination that it is not a random failure in block 1110, in block 1112 the tag bits are compared to '01' to determine if there is a row failure. If the tag bits equal '01' then there is a row redundancy assigned in block 1118 and the tag bits are changed to '11' in block 1124.

Upon the determination that it is not a row failure in block 1112, in block 1114 the tag bits are compared to '10' to determine if there is a column failure. If the tag bits equal '10' then there is a column redundancy assigned in block 1120 and the tag bits are changed to '11' in block 1124. If the tag bits do not equal '10' the address is skipped in block 1130 (as the tag bits must equal '11') and there is a determination of whether the current address is the last repair address in block 1126.

After the tag has been changed in block 1124, there is a determination if the last repair address has been reached in block 1126. If the last repair address has been reached and all addresses have been repaired, the process determines if all of the repair addresses have been through one or two iterations in block 1132. If the repair addresses have been through a single iteration, the cycle repeats and returns to block 1102 where the redundancy information is read for a second time. If the all of the repair addresses have been read twice, the cycle ends in block 1134.

It is expressly understood that the order of the flowchart may be changed in order to enhance efficiencies. For instance, an additional check may be placed just prior to block 1110 to determine if the tag bits equal 11, to allow for the loop to proceed as if the valid bit was not 1 as shown in block 1106. In addition, the first iteration may follow a first pattern of checking for row, column, and then random failures while the second iteration may follow a pattern of checking for random failures first.

For the purpose of clarity, an example may be illustrated in a system substantially similar to the one illustrated in FIG. 5 where a master layer (MS0) is connected to a first slave layer (SL1), a second slave layer (SL2), and a third slave layer (SL3). In the context of this example, this method may be implemented by scanning all redundancy registers from master (MS0) to slave chip (SL2). For each recovery address in MS0 through SL3, if the valid bit is '1', check '01' and '10' cases and assign row and column redundancy respectively. Next, the register bits overwrite '11' to scanned register tag bits, which indicates that the row and columns redundancies have been accounted for. Next all single failure '00' cases are assigned to row or column redundancy and the '00' bits are overwritten with '11'. It is understood that while the redundancy assignment is being performed, relevant fuses of a master layer and slave layers are blown electrically.

It is expressly understood that in case of the slave chips, all redundancy information may be stored into redundancy information registers in the slave chips. Based upon the algorithms discussed in connection with FIG. 7, a determination may be made as to whether the chip is repairable. If the slave chip is repairable, it is stacked with a master layer and other slave layers. Through TSV connection, the master layer can read out all repair information from the master layer and the repair registry of each slave layer. After the master layer has all information related to the failures of each layer, the failures of all layers are assigned to the row and column redundancy of the master chip using electrical fuse blowing that is placed in the master layer and slave layers.

Figure 12:
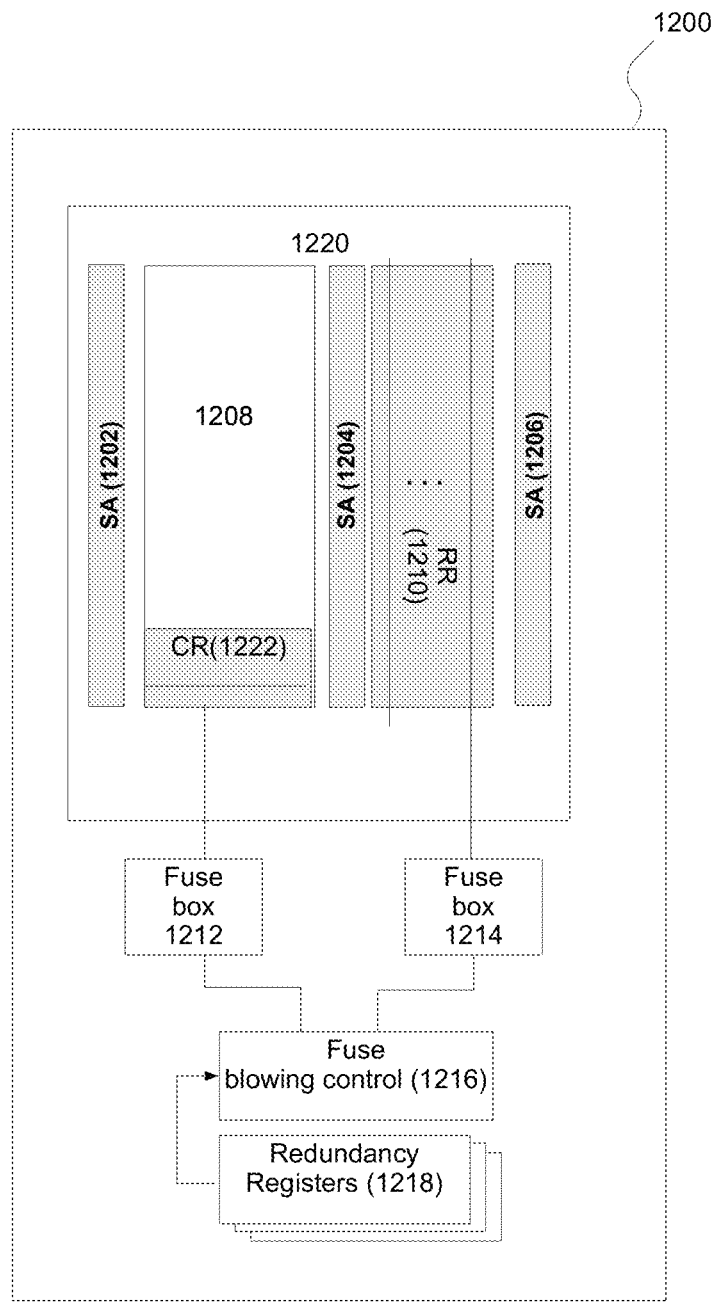
FIG. 12 is a block diagram showing a master layer with a plurality of fuse boxes and redundancy registers according to another embodiment of the present disclosure to show connections among relevant logic blocks.

FIG. 12 shows a master layer 1200 showing one embodiment of a section of a master memory cell array with redundancy 1220 such as might be found on a master layer, a first fuse box 1212, a second fuse box 1214, a fuse blowing control 1216, and redundancy registers 1218. FIG. 12 is a possible embodiment of the connections between the fuse boxes and memory arrays based upon a DRAM configuration. While the example shown is one representative of DRAM, this disclosure should not be interpreted to only be applicable to DRAM, as any configuration of memory that could use the redundant elements disclosed herein could be used.

In the example shown in FIG. 12, the master memory cell array with redundancy 1220 comprises a CR 1222, a RR 1210, a memory cell array 1208, substantially similar in part of the first master memory cell array 102, CR 112, and RR 122. In addition, a sense amplifier (SA) 1204 separates the memory cell array 1208 from the RR 1210. The SA 1204 also separates the CR 1222 from the RR 1210. Additionally, a SA 1202 and a SA 1206 are also shown in FIG. 12.

As known to one skilled in the art, the SA 1202, SA 1204, and SA 1206 are used to read and write data. In some embodiments, the SA devices may be a pair of cross connected inverters placed in-between bit lines (e.g., the first inverter is connected from the positive to the negative bit line, and the second inverter is connected from the negative bit line to the positive bit line). Alternative configurations are contemplated by the present disclosure and alternative circuit elements to the SA devices may be used.

In the embodiment shown in FIG. 12, when either the CR 1222 or RR 1210 is required to provide redundancy, fuse box 1212 or fuse box 1214, respectively, will be electronically blown at the instruction of the fuse blowing control 1216. Redundancy register 1218 is used to store information relating to which type of redundancy is needed and which fuses should be blown by the fuse blowing control 1216.

Figure 13:
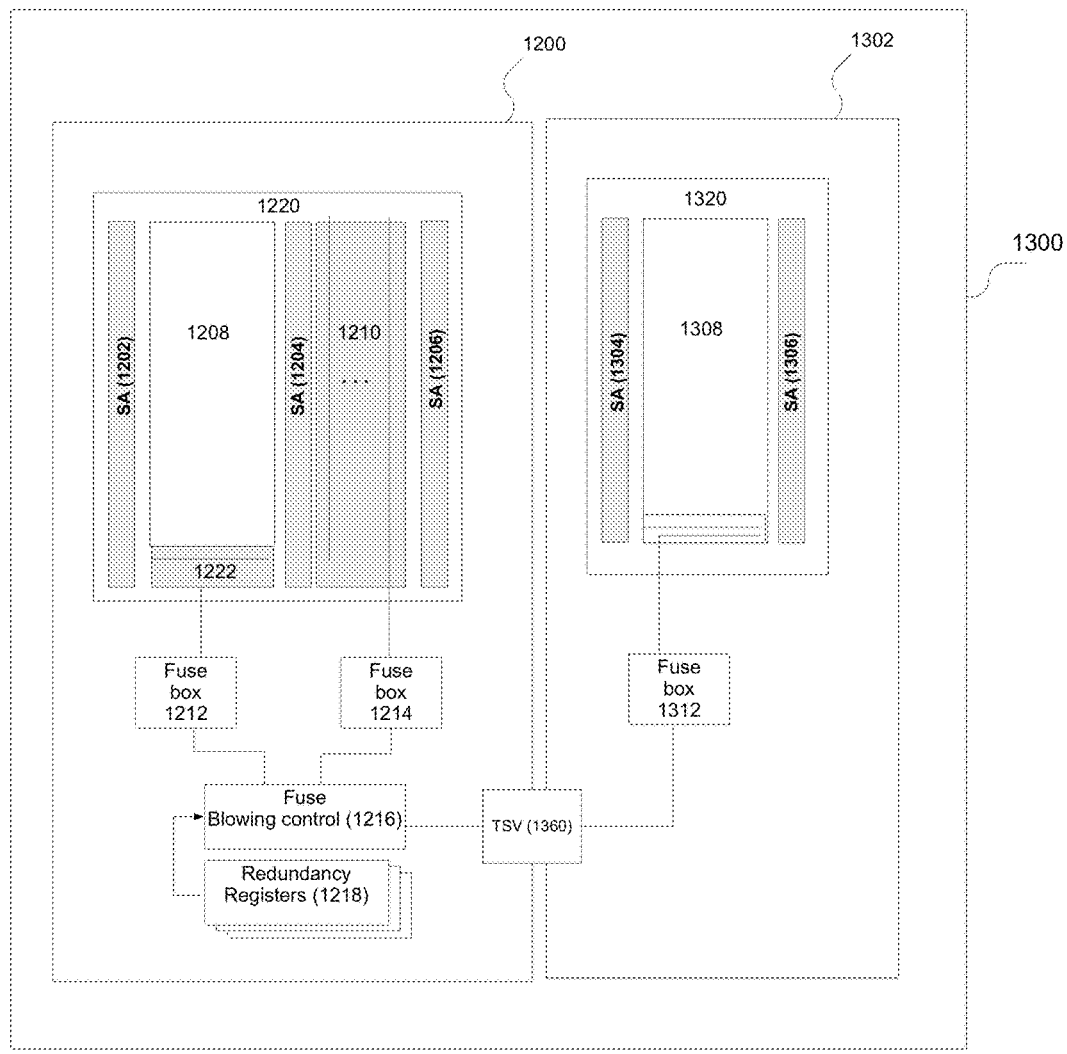
FIG. 13 is a block diagram showing a system with a plurality of fuse boxes and redundancy registers according to another embodiment of the present disclosure to show connection between master and slave layers.

FIG. 13 is shows a system 1300 having the master layer 1200 of FIG. 12 and a slave layer 1302. FIG. 13 is substantially similar to FIG. 12 with the addition of a slave memory cell array 1308 placed in-between a SA 1304 and a SA 1306. A slave fuse box 1312 is connected to the fuse blowing control 1216 through TSVs 1360. The single group of TSVs 1360 in FIG. 13 is intended to be illustrative of a shared TSV connection substantially similar to the combination of the TSVs 160 and the TSVs 260 illustrated in FIG. 3. When a fault occurs in the slave memory cell array 1308, the fuse blowing control is activated and provides redundancy to the slave memory cell array 1308 by relocating the affected addresses on either the RR 1210 or CR 1222, as appropriate.

While FIG. 13 depicts the system 1300 as positioning the master layer 1200 next to the slave layer 1302, it is expressly understood that they could be positioned in any orientation, including both layers being stacked vertically.

FIG. 13, as illustrated, comprises a master and slave memory cell array that may be referred to as a single bank DRAM structure. However, it is expressly understood that any number of master and slave memory arrays may be used consistent with the disclosure, including a four-bank memory structure. It is understood that in some embodiments, the TSVs 160 are placed in middle of each layer, as shown in FIG. 1. The TSVs illustrated in FIG. 13 are for the purpose of illustrating connectivity between the master layer 1200 and slave layer 1302.

In the example shown in FIG. 13, some TSV 1360 holes are related with coupled connections to the redundancy register 1218. Each layer selection is done separately, and each layer is assigned an address. For example, the master layer 1200 may be assigned an ID MS0 and the slave layer 1302 may be assigned an ID SL1. A layer ID generation or fuse based ID assignment can be used for this dedicated redundancy approach. By this unique layer ID, common connected TSVs can access the redundancy information register of each slave chip without logical data contention. This unique layer ID may be used as the MSB information discussed above.

In this configuration, each bank has dedicated fuse boxes to switch failures of each layer with row and column redundancy into the master layer. In some embodiments, between master and slave layers, only the same bank can have common fuse boxes. In these embodiments, between banks there is no sharing of row or column redundancy. These embodiments avoid a malfunction of refresh operations and same bank access failures between two layers while back-to-back bank operations are being performed between two different banks. For example, while the master chip is accessing redundancy cell array 1210 in the master layer due to the defect cells of master memory array 1208 if another slave chip accesses redundant cells of master redundant memory cell array 1210 of the master layer due to failures of slave memory cell array 1308, simultaneously, two word lines in the same sub-block of 1210 at the same bank are activated, resulting in read and write errors. Because each bank has separate control logic blocks, the user should be able to access each bank independently at any time. A column redundancy at each sub-block placed between the sense amplifiers replaces independently redundant cells among sub-blocks without simultaneous placement of all sub-block column redundancy. It should be understood that in some embodiments, when a column fails on a sub-block, the column cannot be replaced with column redundancy of other sub-blocks in the same bank.

This proposed approach has an additional advantage of more flexible selection than the prior approach and better usage of the address repair fuse. In addition, the systems, methods, apparatuses and devices disclosed herein allow for dedicated redundancy sub-blocks to be stored only in the master chip, the failure location addresses of which are stored in the redundancy register of each chip, so that redundancy information is read out through TSV connections, and a determination of the repairable or non-repairable status of each chip can be made before making three dimensional stacked memory. In addition, it is further understood that the present disclosure further permits the scanning of all failure location (repair) information from all stacked memory chips after stacking memories and the usage of a valid bit and tag bits to assign row and column redundancy to all defected cells of all chips into a master chip with all redundancy relevant logic blocks. Yet another advantage disclosed herein is the double scanning to get optimized row and column redundancy assignment.

In some embodiments of the present disclosure it is expressly understood that a first master layer could be used with a plurality of slave layers. The master layer may be substantially similar to the slave layers with the addition of redundancy rows and columns or the omission of additional memory cell arrays and only the presence of redundancy rows and columns. It is further expressly understood that the TSVs may be changed to a different connection, such as a pin connection, whereby a master is placed onto a device such as a motherboard and provides redundancy for memory that is placed onto the motherboard.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other products shown or discussed as directly coupled or communicating with each other may be coupled through some interface or device, such that the products may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

It should be understood that although an implementation of one embodiment of the present disclosure is illustrated above, the present system may be implemented using any number of techniques, whether currently known or in existence. The present disclosure should in no way be limited to the exemplary implementations, drawings, and techniques illustrated above, including the exemplary design and implementation illustrated and described herein, but may be modified within the scope of the appended claims along with their full scope of equivalents.

What is claimed is:

1. A system, comprising:
    a first layer comprising a first redundant memory element, an input/output interface, a first layer fuse box, and a fuse blowing control;
    a second layer coupled to the first layer through a first connection comprising a second layer memory element and a second layer fuse box coupled to the first redundant memory element; and
    a redundancy register coupled to the first layer, wherein upon the failure of part of the second layer memory element, the redundancy register provides information to the fuse blowing control that allocates part of the first redundant memory element to provide redundancy for the failed part of the second layer memory element by blowing elements in the first layer fuse box and the second layer fuse box.

2. The system of claim 1, wherein the first layer further comprises a first layer memory element.

3. The system of claim 2, wherein the first redundant memory element comprises column redundant memory and row redundant memory.

4. The system of claim 1, wherein the connection is a through silicon vias (TSV) connection.

5. The system of claim 2, further comprising a third layer coupled to the first layer through the second layer, wherein the third layer comprises a third layer memory element and a third layer fuse box coupled to the first redundant memory element.

6. The system of claim 5, further comprising a fourth layer coupled to the first layer, wherein the fourth layer comprises a fourth layer memory element and a fourth layer fuse box coupled to the first redundant memory element.

7. The system of claim 6, comprising a fifth layer coupled to the first layer through a second connection, wherein the fifth layer comprises a fifth layer memory element and a fifth fuse box coupled to the first redundant memory element through a second connection.

8. The system of claim 5, wherein the input/output interface is coupled to a layer comprising a second redundant memory element, a second input/output interface, and a second fuse blowing control.

9. The system of claim 1, wherein the second layer further comprises a redundant memory element.

10. A method, comprising:
    verifying a plurality of memory cells located across at least three layers of semiconductor material comprising memory cells;
    determining the location of faults within the at least three layers of semiconductor material comprising memory cells;
    assigning a type to each of the faults within the at least three layers of semiconductor material comprising memory cells;
    determining if the chip is repairable based upon the location and type of faults based upon the faults of at least two of the three layers being repairable by one of the layers; and
    storing repair information on one of the layers.

11. The method of claim 10, further comprising:
    allocating space on one of the layers to provide redundancy for faults located on at least two layers.

12. The method of claim 11, wherein the repair information comprises row addresses, column address, a valid bit, and two tag bits.

13. The method of claim 12, wherein the two tag bits are used to represent the type of fault, and wherein the type of fault is selected from the group: a row, column, or single fault.

14. The method of claim 11, wherein the repair information is stored in a redundancy register.

15. The method of claim 11, wherein the allocation is preformed by blowing at least one fuse in a fuse box.

16. The method of claim 11, wherein the allocation comprises reading all repair information, and in a first iteration assigning redundancy for column and row failures and in a second iteration assigning redundancy for single failures.

* * * * *